United States Patent
Sekaric et al.

(10) Patent No.: US 7,943,530 B2
(45) Date of Patent: May 17, 2011

(54) SEMICONDUCTOR NANOWIRES HAVING MOBILITY-OPTIMIZED ORIENTATIONS

(75) Inventors: Lidija Sekaric, Mount Kisco, NY (US); Tymon Barwicz, Mount Kisco, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 12/417,796

(22) Filed: Apr. 3, 2009

(65) Prior Publication Data

US 2010/0252814 A1    Oct. 7, 2010

(51) Int. Cl.
*H01L 21/31* (2006.01)
*H01L 21/469* (2006.01)

(52) U.S. Cl. ........ 438/770; 438/311; 438/775; 438/513; 257/E21.17; 257/E21.32; 257/E21.126; 257/E21.127; 257/E21.229; 257/E21.252; 257/E21.253; 257/E21.267; 257/E21.632

(58) Field of Classification Search .................. 438/197, 438/199, 311, 505, 508, 513, 602, 603, 604, 438/706, 680, 752, 753, 770, 775, 780; 257/E21.17, 257/32, 126, 127, 229, 252, 253, 267, 632, 257/82

See application file for complete search history.

(56) References Cited

U.S. PATENT DOCUMENTS

| | | | |
|---|---|---|---|
| 6,231,744 B1 | 5/2001 | Ying et al. | |
| 6,248,674 B1 | 6/2001 | Kamins et al. | |
| 6,656,573 B2 | 12/2003 | Chen et al. | |
| 6,720,240 B2 | 4/2004 | Gole et al. | |
| 6,798,000 B2 | 9/2004 | Luyken | |
| 6,831,017 B1 | 12/2004 | Li et al. | |
| 6,841,235 B2 | 1/2005 | Weiner et al. | |
| 6,843,902 B1 | 1/2005 | Penner et al. | |
| 6,882,051 B2 | 4/2005 | Majumdar et al. | |
| 6,897,098 B2 * | 5/2005 | Hareland et al. | ............... 438/128 |
| 6,969,679 B2 | 11/2005 | Okamura et al. | |
| 7,067,328 B2 | 6/2006 | Dubrow et al. | |
| 7,067,341 B2 | 6/2006 | Mascolo et al. | |
| 7,081,293 B2 | 7/2006 | Weiner | |
| 7,135,728 B2 | 11/2006 | Duan et al. | |
| 7,164,209 B1 | 1/2007 | Duan et al. | |

(Continued)

OTHER PUBLICATIONS

Chang et al., "CMOS Circuit Performance Enhancement by Surface Orientation Optimization", IEEE Transactions on Electron Devices, Oct. 2004, pp. 1621-1627, vol. 51.

*Primary Examiner* — David Nhu
(74) *Attorney, Agent, or Firm* — Scully, Scott, Murphy & Presser, P.C.

(57) ABSTRACT

Prototype semiconductor structures each including a semiconductor link portion and two adjoined pad portions are formed by lithographic patterning of a semiconductor layer on a dielectric material layer. The sidewalls of the semiconductor link portions are oriented to maximize hole mobility for a first-type semiconductor structures, and to maximize electron mobility for a second-type semiconductor structures. Thinning by oxidation of the semiconductor structures reduces the width of the semiconductor link portions at different rates for different crystallographic orientations. The widths of the semiconductor link portions are predetermined so that the different amount of thinning on the sidewalls of the semiconductor link portions result in target sublithographic dimensions for the resulting semiconductor nanowires after thinning. By compensating for different thinning rates for different crystallographic surfaces, semiconductor nanowires having optimal sublithographic widths may be formed for different crystallographic orientations without excessive thinning or insufficient thinning.

20 Claims, 7 Drawing Sheets

U.S. PATENT DOCUMENTS

| | | |
|---|---|---|
| 7,176,505 B2 | 2/2007 | Rueckes et al. |
| 7,182,996 B2 | 2/2007 | Hong |
| 7,183,568 B2 | 2/2007 | Appenzeller et al. |
| 7,189,605 B2 * | 3/2007 | Lee .............................. 438/200 |
| 7,189,635 B2 | 3/2007 | Sharma |
| 7,208,094 B2 | 4/2007 | Islam et al. |
| 7,211,464 B2 | 5/2007 | Lieber et al. |
| 7,217,946 B2 | 5/2007 | Fraboulet et al. |
| 2002/0014667 A1 | 2/2002 | Shin et al. |
| 2006/0105513 A1 | 5/2006 | Afzali-Ardakani et al. |
| 2006/0151844 A1 | 7/2006 | Avouris et al. |
| 2010/0252800 A1 * | 10/2010 | Chidambarrao et al. ......... 257/9 |

* cited by examiner

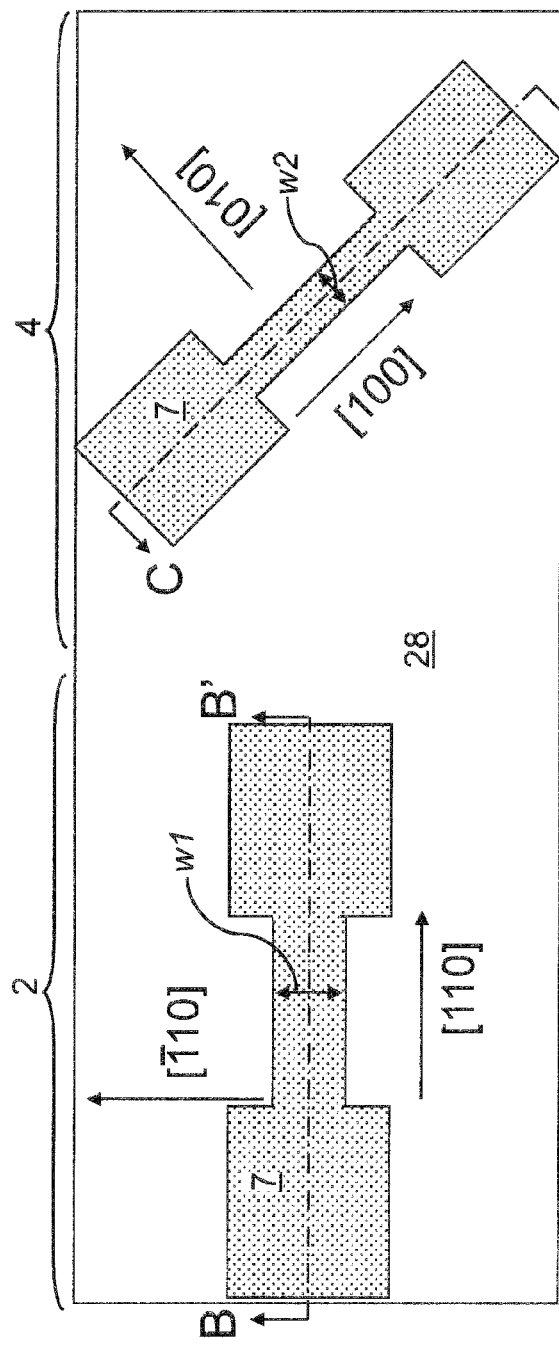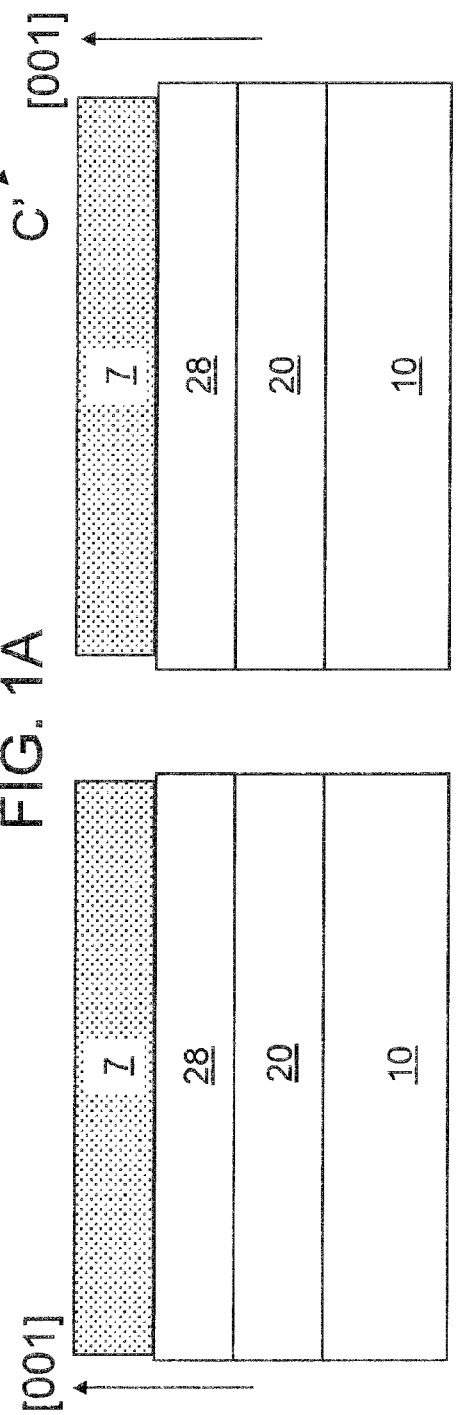

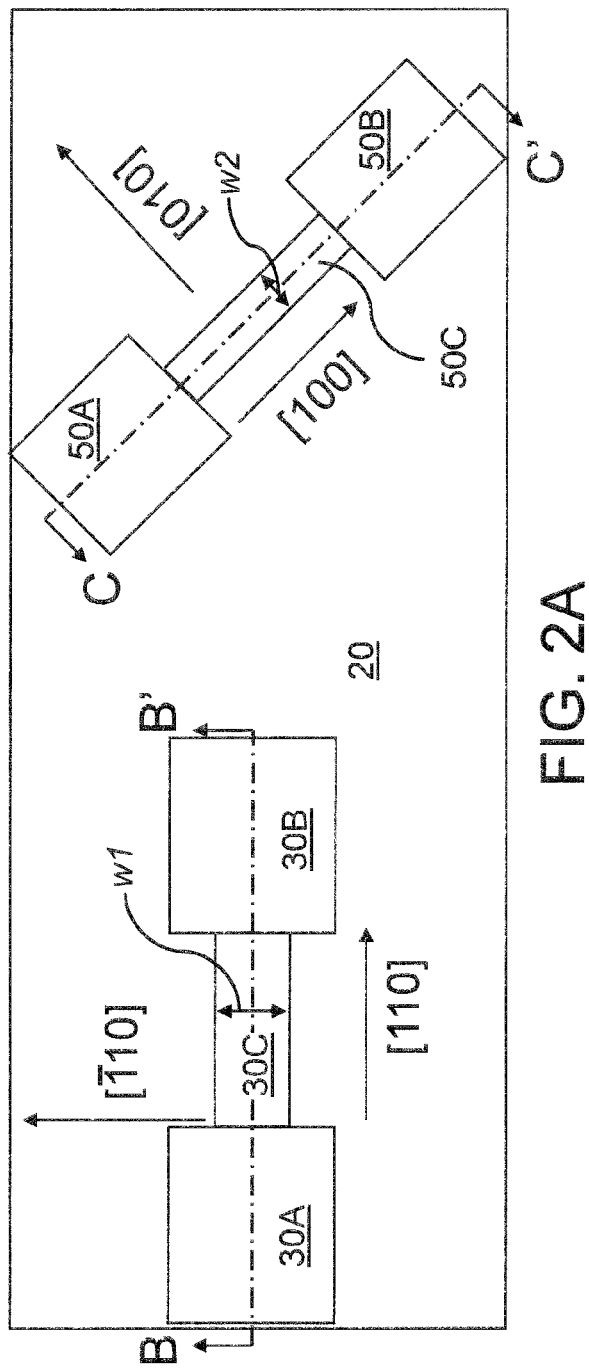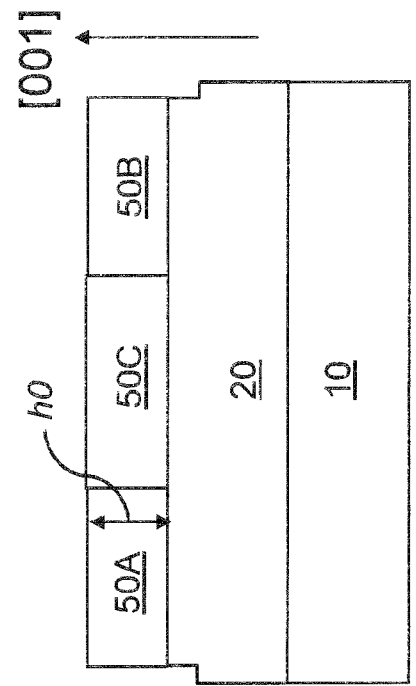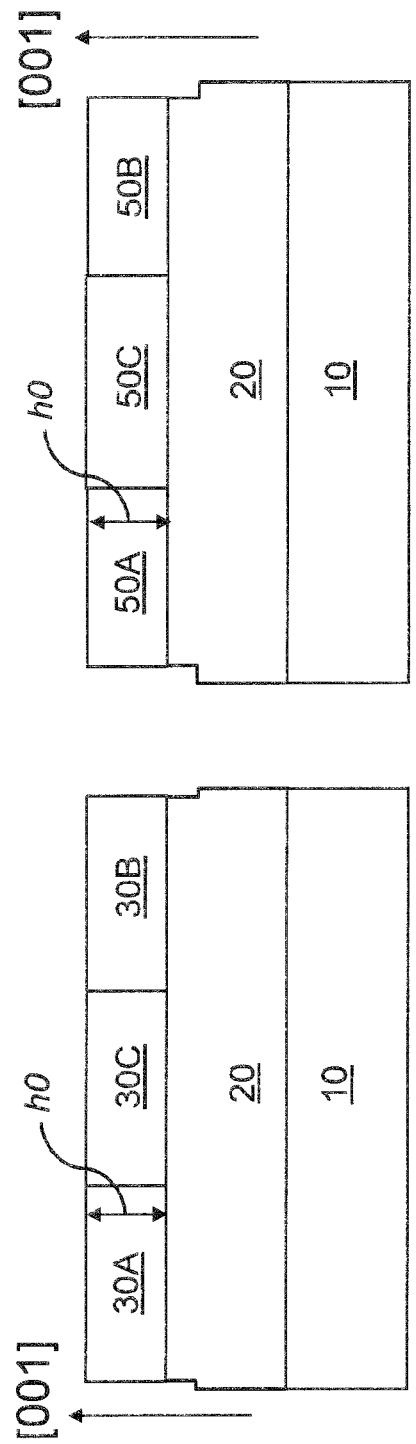

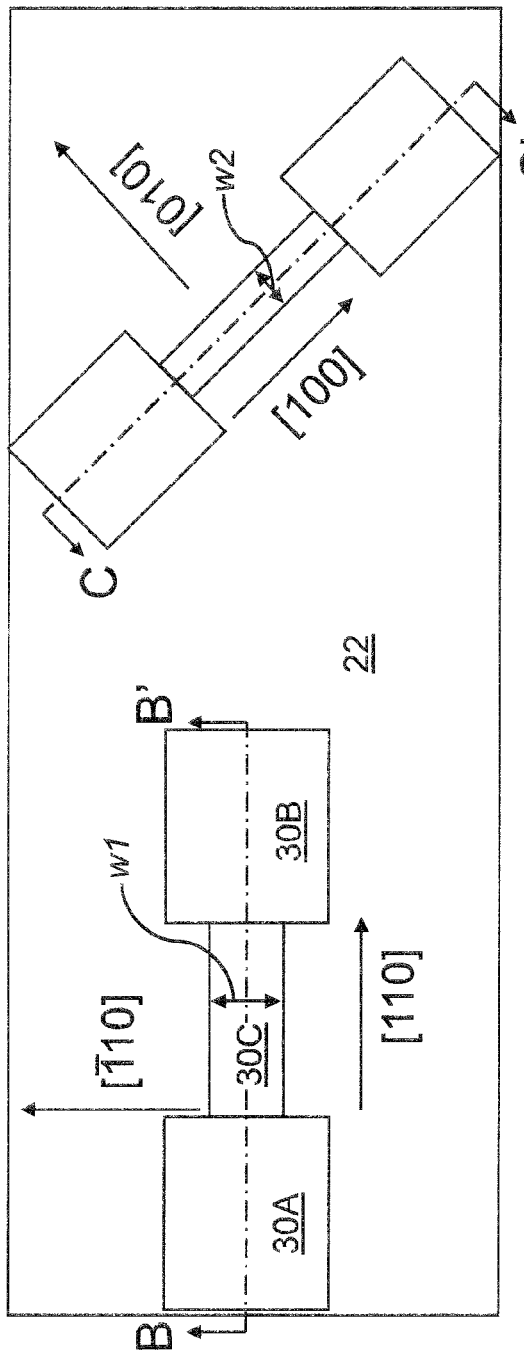
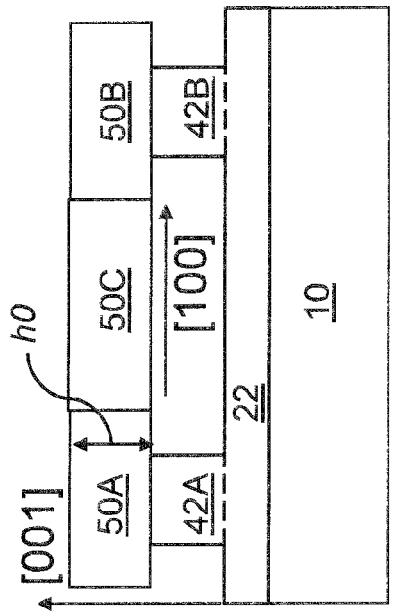
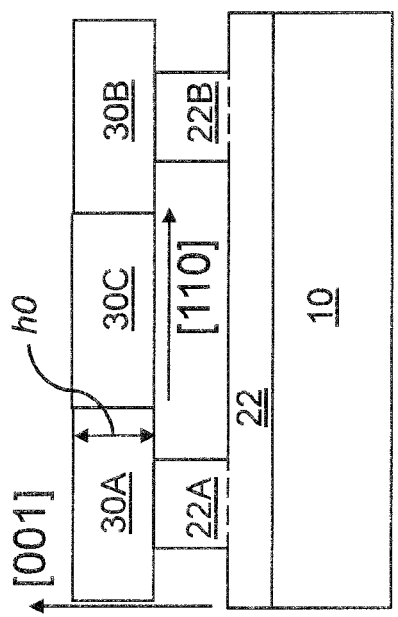
FIG. 3A
FIG. 3B
FIG. 3C

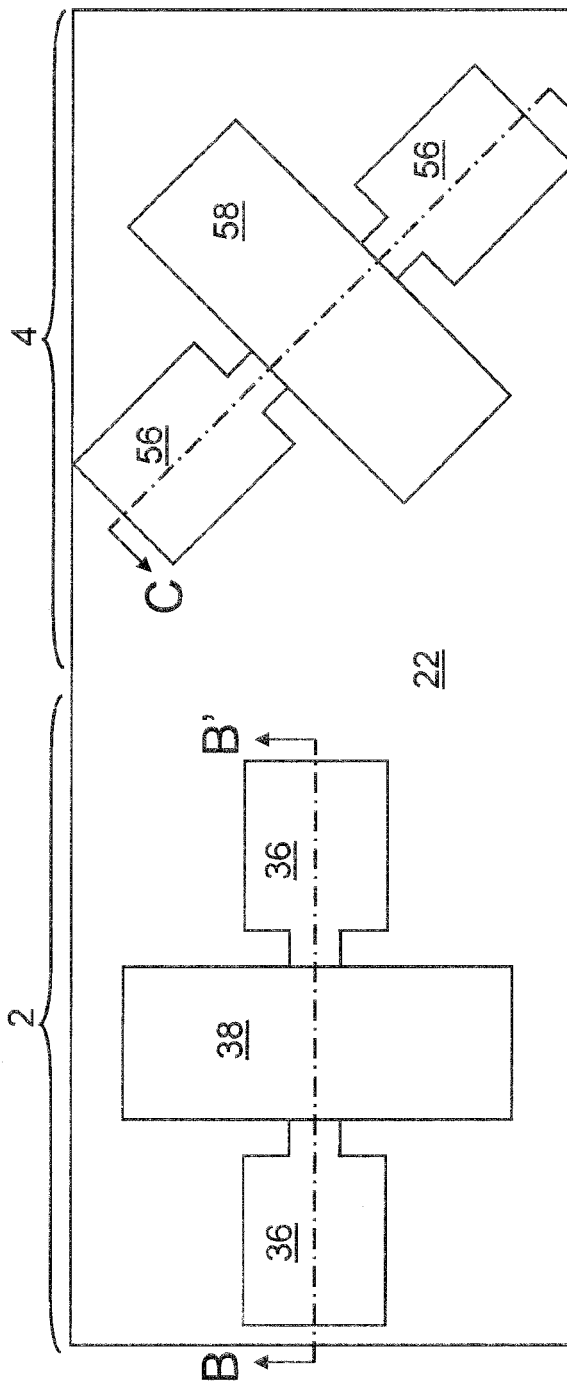
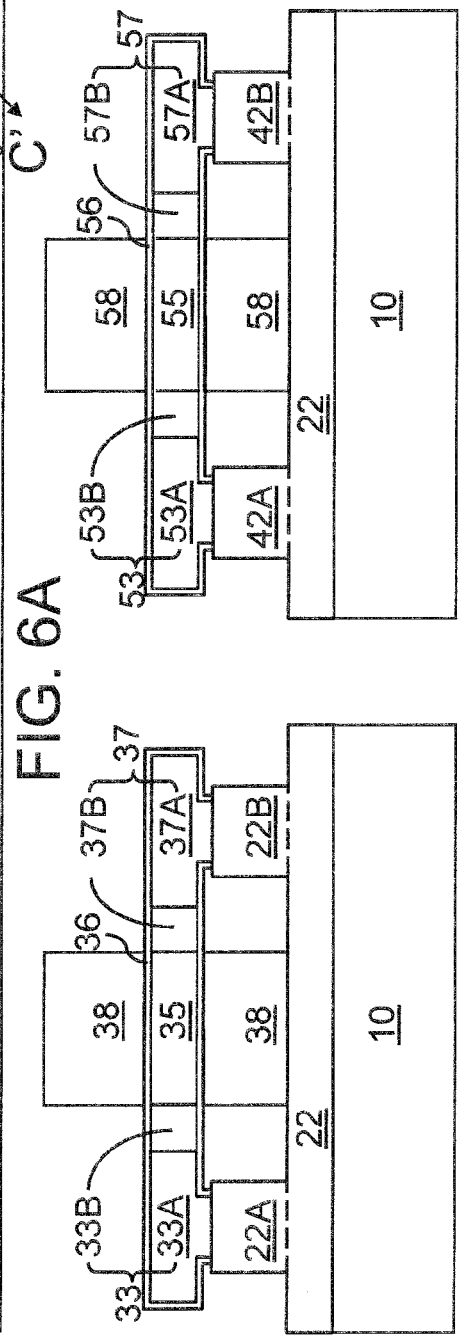
FIG. 6A
FIG. 6B
FIG. 6C

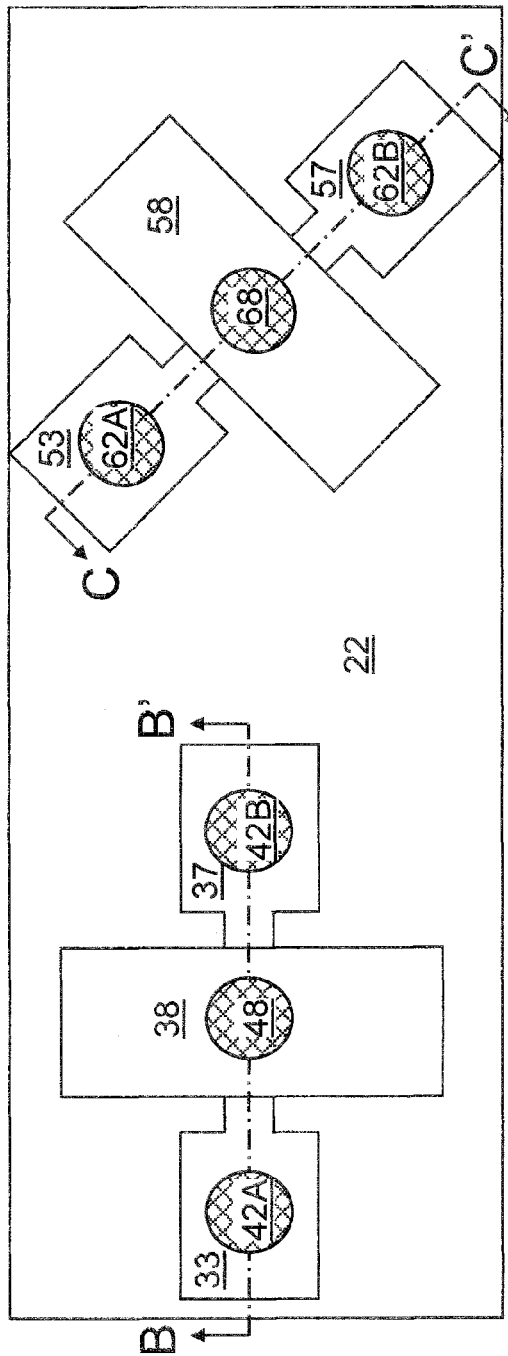
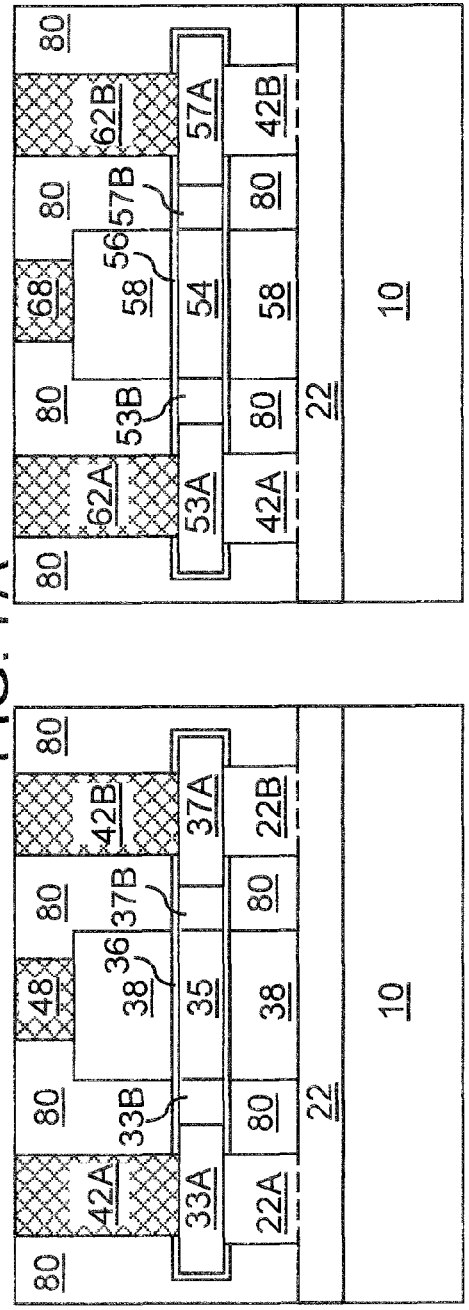
FIG. 7A
FIG. 7B
FIG. 7C

SEMICONDUCTOR NANOWIRES HAVING MOBILITY-OPTIMIZED ORIENTATIONS

FIELD OF THE INVENTION

The present invention relates to semiconductor devices, and particularly to semiconductor nanowires having mobility-optimized orientations and methods of manufacturing the same.

BACKGROUND OF THE INVENTION

A semiconductor nanowire refers to a semiconductor wire having transverse lateral and vertical dimensions of the order of a nanometer ($10^{-9}$ meter) or tens of nanometers. Typically, the transverse lateral dimension and the vertical dimension are less than 20 nm.

The limitation on the lateral dimension applies to the transverse lateral dimension (the width) and the vertical lateral dimension (the height). The longitudinal lateral dimension (the length) of the semiconductor nanowire is unlimited, and may be, for example, from 1 nm to 1 mm. When the lateral dimensions of the semiconductor nanowire is less than tens of nanometers, quantum mechanical effects become important. As such, semiconductor nanowires are also called semiconductor quantum wires.

The transverse lateral dimension of a semiconductor nanowire is currently sublithographic, i.e., may not be printed by a direct image transfer from a photoresist that is patterned by a single exposure. As of 2008, the critical dimension, i.e., the smallest printable dimension that may be printed by lithographic methods, is about 35 nm. Dimensions less than the critical dimension are called sublithographic dimensions. At any given time, the critical dimension and the range of the sublithographic dimension are defined by the best available lithographic tool in the semiconductor industry. In general, the critical dimension and the range of the sublithographic dimension decreases in each successive technology node and established by a manufacturing standard accepted across the semiconductor industry.

A semiconductor nanowire enables enhanced control of the charge carriers along the lengthwise direction through a complete encirclement of the cross-sectional area of the semiconductor nanowire by a gate dielectric and a gate electrode. The charge transport along the semiconductor nanowire by the gate electrode is better controlled in a semiconductor nanowire device than in a fin field effect transistor (finFET) because of the complete encirclement of the semiconductor nanowire.

For high performance complementary metal-on-semiconductor (CMOS) circuit, high performance p-type semiconductor nanowire devices and n-type semiconductor nanowire devices that provide high on-current and low off-current are desired.

SUMMARY OF THE INVENTION

Prototype semiconductor structures each including a semiconductor link portion and two adjoined pad portions are formed by lithographic patterning of a semiconductor layer on a dielectric material layer. The sidewalls of the semiconductor link portions are oriented to maximize hole mobility for a first-type semiconductor structure, and to maximize electron mobility for a second-type semiconductor structure. Thinning by oxidation of the semiconductor structures reduces the width of the semiconductor link portions at different rates for different crystallographic orientations. The widths of the semiconductor link portions are predetermined so that the different amount of thinning on the sidewalls of the semiconductor link portions results in target sublithographic dimensions for the resulting semiconductor nanowires after thinning. By compensating for different thinning rates for different crystallographic surfaces, semiconductor nanowires having optimal sublithographic widths may be formed for different crystallographic orientations without excessive thinning or insufficient thinning.

According to an aspect of the present invention, a method of forming a semiconductor structure is provided, which includes patterning a first semiconductor structure including a first semiconductor link portion, wherein the first semiconductor structure has a first pair of sidewalls that are separated by a first width w1 and has a first surface orientation having a first oxidation rate in an oxidizing ambient; patterning a second semiconductor structure including a second semiconductor link portion, wherein the second semiconductor link portion has a second pair of sidewalls that are separated by a second width w2 and has a second surface orientation having a second oxidation rate in the oxidizing ambient; forming a first semiconductor nanowire having a third width w3 by thinning the first semiconductor link; and forming a second semiconductor nanowire having a fourth width w4 by thinning the second semiconductor link, wherein the third width w3 and the fourth width w4 are sublithographic dimensions.

In one embodiment, a ratio R of a difference between the first width w1 and the third width w3 to a difference between the second width w2 and the fourth width w4 is the same as the ratio of the first oxidation rate to the second oxidation rate, i.e., the first width w1 and the second width w2 are determined by the formula, $(w1-w3)/(w2-w4)=R$, where R expresses the effective ratio of the first to the second oxidation rates. The value of R is a function of oxidation temperature, the dimensions of the semiconductor link portion and the crystallographic orientations of the first and second surface orientation. R will generally have a value between 0.1 and 10. The exact value of R can be found by methods known to one skilled in the art such as finite element oxidation simulations. As an example, if the first surface orientation is [110] and the second surface orientation is [100] and both semiconductor link portions have cross-sectional dimensions around 70 nm, the value of R will be 1.06 for a steam oxidation at 800° C.

According to another aspect of the present invention, a semiconductor structure includes a first semiconductor structure and a second semiconductor structure. The first semiconductor structure includes a first semiconductor structure including a first semiconductor nanowire, a first source-side pad and a first drain-side pad, wherein each of the first source-side pad and the first drain-side pad adjoins the first semiconductor nanowire and comprises a semiconductor material having a doping of a second conductivity type, and wherein a middle portion of the first semiconductor nanowire comprises the semiconductor material and has a doping of a first conductivity type and has a first pair of sidewalls having a first surface orientation and separated by a sublithographic width, wherein the second conductivity type is the opposite of the first conductivity type. The second semiconductor structure includes a second semiconductor nanowire, a second source-side pad and a second drain-side pad, wherein each of the second source-side pad and the second drain-side pad adjoins the second semiconductor nanowire and comprises the semiconductor material having a doping of the first conductivity type, and wherein the second semiconductor nanowire comprises the semiconductor material and has a doping of the second conductivity type and has a second pair of sidewalls having a second surface orientation and separated by another sublithographic width which is between 80% and 125% of the sublithographic width, wherein the second surface orientation is different from the first surface orientation.

BRIEF DESCRIPTION OF THE DRAWINGS

FIG. 1A is a top-down view of an exemplary semiconductor structure after application and patterning of a photoresist on a semiconductor-on-insulator (SOI) substrate. FIG. 1B is a vertical cross-sectional view of the exemplary semiconductor structure along the plane B-B' at the step corresponding to FIG. 1A. FIG. 1C is a vertical cross-sectional view of the exemplary semiconductor structure along the plane C-C' at the step corresponding to FIG. 1A.

FIG. 2A is a top-down view of the exemplary semiconductor structure after patterning of semiconductor link portions and semiconductor pads. FIG. 2B is a vertical cross-sectional view of the exemplary semiconductor structure along the plane B-B' at the step corresponding to FIG. 2A. FIG. 2C is a vertical cross-sectional view of the exemplary semiconductor structure along the plane C-C' at the step corresponding to FIG. 2A.

FIG. 3A is a top-down view of the exemplary semiconductor structure after formation of insulator pedestals. FIG. 3B is a vertical cross-sectional view of the exemplary semiconductor structure along the plane B-B' at the step corresponding to FIG. 3A. FIG. 3C is a vertical cross-sectional view of the exemplary semiconductor structure along the plane C-C' at the step corresponding to FIG. 3A.

FIG. 6A is a top-down view of the exemplary semiconductor structure after formation of gate electrodes. FIG. 6B is a vertical cross-sectional view of the exemplary semiconductor structure along the plane B-B' at the step corresponding to FIG. 6A. FIG. 6C is a vertical cross-sectional view of the exemplary semiconductor structure along the plane C-C' at the step corresponding to FIG. 6A.

FIG. 7A is a top-down view of the exemplary semiconductor structure after formation of a middle-of-line (MOL) dielectric layer and contact vias. A middle-of-line (MOL) dielectric layer 80 is omitted in FIG. 7A for clarity. FIG. 7B is a vertical cross-sectional view of the exemplary semiconductor structure along the plane B-B' at the step corresponding to FIG. 7A. FIG. 7C is a vertical cross-sectional view of the exemplary semiconductor structure along the plane C-C' at the step corresponding to FIG. 7A.

DETAILED DESCRIPTION OF THE INVENTION

Figure 4A:
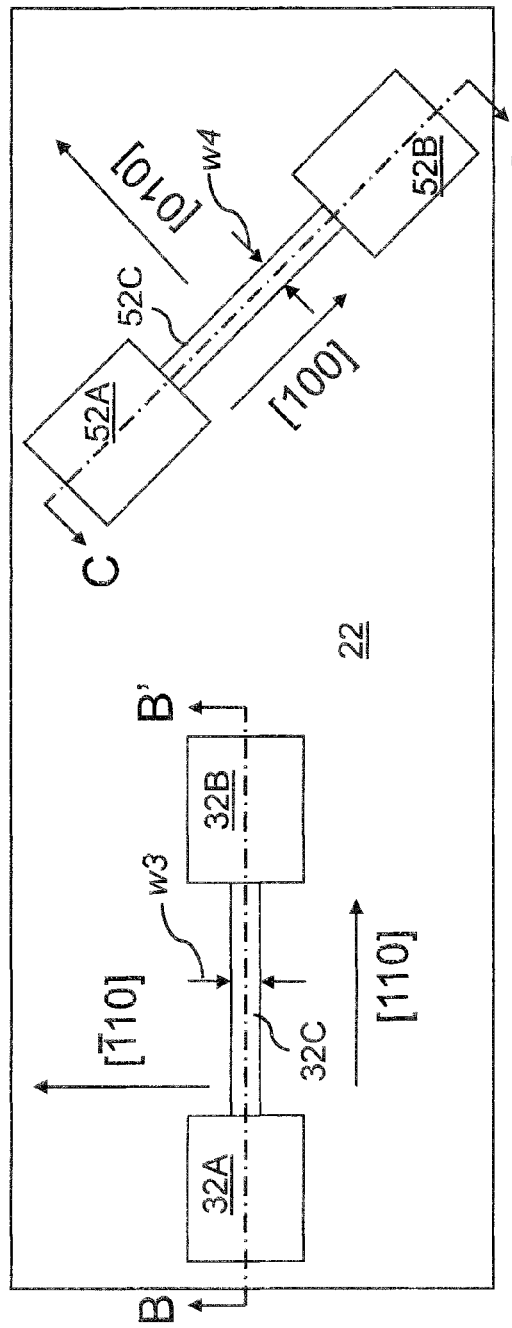
FIG. 4A is a top-down view of the exemplary semiconductor structure after formation of semiconductor nanowires.

As stated above, the present invention relates to semiconductor nanowires having mobility-optimized orientations and methods of manufacturing the same, which are now described in detail with accompanying figures. It is noted that like and corresponding elements are referred to by like reference numerals.

Referring to FIGS. 1A-1C, an exemplary semiconductor structure according to the present invention includes a semiconductor-on insulator (SOI) substrate which contains a handle substrate 10, a buried insulator layer 20, and a top semiconductor layer 28. The top semiconductor layer 28 comprises a semiconductor material, which may be selected from, but is not limited to silicon, germanium, silicon-germanium alloy, silicon carbon alloy, silicon-germanium-carbon alloy, gallium arsenide, indium arsenide, indium phosphide, compound semiconductor materials, II-VI compound semiconductor materials, organic semiconductor materials, and other compound semiconductor materials. In one embodiment, the top semiconductor layer 28 may include a Si-containing semiconductor material such as single crystalline silicon or a single crystalline silicon-germanium alloy.

Preferably, the entirety of the semiconductor material within the top semiconductor layer 28 is single crystalline material, i.e., has an epitaxial atomic alignment throughout. In this case, the crystallographic orientation of the surface normal of the top surface of the top semiconductor layer 28 is herein referred to as a surface orientation of the top surface of the top semiconductor layer 28. While the top surface of the top semiconductor layer 28 may be any crystallographic orientation, a major crystallographic orientation with low Miller indices are typically selected for the surface orientation of the top surface of the top semiconductor layer. While the present invention is illustrated with a [001] surface orientation for the top surface of the top semiconductor layer 28, any other surface orientation may be substituted for the [001] surface orientation. It is preferred that the surface orientation for the top surface of the top semiconductor layer 28 is one of the surface orientations at which either hole mobility or electron mobility is at a maximum at least locally, and preferably globally among all available crystallographic orientations. The thickness of the top semiconductor layer 28 may be from 10 nm to 200 nm, although lesser and greater thicknesses are also contemplated herein.

The top semiconductor layer 28 may be doped with electrical dopants as needed. For example, a first device region 2 may be doped with dopants of a first conductivity type and a second device region 4 may be doped with dopants of a second conductivity type, which is the opposite of the first conductivity type. For example, the first conductivity type may be p-type and the second conductivity type may be n-type, or vice versa. The top semiconductor layer 28 may be provided as a substantially intrinsic semiconductor layer, or may be provided with p-type doping or n-type doping. Patterned ion implantation masks may be employed during ion implantation or plasma doping to insure that the first device region 2 and the second device region are doped with appropriate doping. Typically, the dopant concentration in doped regions is in the range from $5.0\times10^{14}/cm^3$ to $3.0\times10^{17}/cm^3$, although lesser and greater dopant concentrations are also contemplated herein. In the non-limiting illustrative example described herein, the first conductivity type may be p-type and the second conductivity type may be n-type, i.e., the first device region 2 is doped with p-type dopants and the second device region 4 is doped with n-type dopants.

The buried insulator layer 20 is a dielectric material layer, i.e., a layer including a dielectric material. The dielectric material of the buried insulator layer 20 may be, for example, silicon oxide, silicon nitride, silicon oxynitride, quartz, a ceramic material, or a combination thereof. The thickness of the buried insulator layer 20 may be from 50 nm to 1,000 nm, although lesser and greater thicknesses are also contemplated herein. The handle substrate 10 may comprise a semiconductor material, an insulator material, or a conductive material. In some cases, the handle substrate 10 and the buried insulator layer 20 may comprise the same dielectric material and may be of unitary and integral construction.

A photoresist 7 is applied to the top surface of the top semiconductor layer 28 and is lithographically patterned to form a first shape and a second shape. The first shape includes a first link shape, which has a rectangular shape and a constant first width w1 in a top-down view. The first width w1 is a lithographic dimension, i.e., a dimension that may be printed with a single lithographic exposure. Thus, the first width w1 is greater than 40 nm, while it is contemplated that a lesser first width w1 may be formed as lithography tools improve in the future. Typically, the first width w1 is a critical dimension, i.e., lithographically printable minimum dimension, or a dimension close to the critical dimension. The first link shape is laterally adjoined by a first pad shape and a second pad shape, which have wider widths than the first link shape. The lengthwise direction of the first link shape, which is horizontal and is perpendicular to the direction of the first width w1, is herein referred to as a first horizontal direction. The widthwise direction of the first link shape, which is the direction of the first width w1, is herein refereed to as a second horizontal direction. In a non-limiting illustrative example, the first horizontal direction may be a [110] crystallographic orientation and the second horizontal direction may be a [$\bar{1}$10] crystallographic orientation.

The second shape includes a second link shape, which has a rectangular shape and a constant second width w2 in a top-down view. The second width w2 is a lithographic dimension, and is typically a critical dimension or a dimension close to the critical dimension. The second link shape is laterally adjoined by a third pad shape and a fourth pad shape, which have wider widths than the second link shape. The lengthwise direction of the second link shape, which is horizontal and is perpendicular to the direction of the second width w2, is herein referred to as a third horizontal direction. The third horizontal direction is different from the first horizontal direction. The third horizontal direction may be at a non-orthogonal angle relative to the first horizontal direction, or may be at an orthogonal angle relative to the first horizontal direction. The widthwise direction of the second link shape, which is the direction of the second width w2, is herein referred to as a fourth horizontal direction. In a non-limiting illustrative example, the third horizontal direction may be a [100] crystallographic orientation and the fourth horizontal direction may be a [010] direction.

Preferably, the first horizontal direction and the third horizontal direction are selected to include vertical planes at which hole mobility or electron mobility is at a local maximum at least, and preferably at a maximum among all vertical planes in the single crystalline semiconductor layer constituting the top semiconductor layer 28. In case the top semiconductor layer 28 is doped with dopants of the first conductivity type in the first device region 2 and doped with dopants of the second conductivity type in the second device region 4, the first horizontal direction may be selected to maximize the mobility of charge carriers of the second conductivity type and the third horizontal direction may be selected to maximize the mobility of charge carriers of the first conductivity type. For example, if the first conductivity type is n-type and the second conductivity type is p-type, the first horizontal direction may be selected to include a vertical crystallographic plane that maximizes hole mobility and the third horizontal direction may be selected to include a vertical crystallographic plane that maximizes the electron mobility. If the semiconductor material is single crystalline silicon and the top surface of the top semiconductor layer 28 has a (001) surface orientation, such a requirement may be satisfied by selecting a [110] direction as the first horizontal direction so that the vertical plane including the [110] direction and the [001] direction has a ($\bar{1}$10) surface orientation and by selecting a [100] direction as the third horizontal direction so that the vertical plane including the [100] direction and the [001] direction has a (010) surface orientation. The top semiconductor layer 28 does not have to be doped in which case the conductivity carrier type (holes or electrons) will be determined by the doping of the gate electrode, the source and the drain.

The first width w1 and the second width w2 are predetermined based on a formula involving oxidation rates of semiconductor surfaces of the top semiconductor layer 28 perpendicular to the second horizontal direction and the fourth horizontal direction as well as the target widths of semiconductor nanowires to be formed by thinning of semiconductor link portions to be subsequently formed in the top semiconductor layer. While determination of the first width w1 and the second width w2 are performed prior to patterning the photoresist 7, the formula is described based on dimensions of structures to be subsequently formed. For this reason, the formula is described below at a subsequent processing step.

Referring to FIGS. 2A-2C, the pattern in the photoresist 7 is transferred into the top semiconductor layer 28 and an upper portion of the buried insulator layer 20, for example, by an anisotropic etch. The exposed portions of the top semiconductor layer 28 and the upper portions of the buried insulator layer 20 directly underneath are removed by the anisotropic etch. The remaining portions of the top semiconductor layer 28 includes a first semiconductor structure formed in the first device region 2 and a second semiconductor structure formed in the second device region 4. The first semiconductor structure includes a first semiconductor link portion 30C, a first source-side pad 30A laterally abutting the first semiconductor link portion 30C on one side, and a first drain-side pad 30B laterally abutting the first semiconductor link portion 30C on an opposite side. The second semiconductor structure includes a second semiconductor link portion 50C, a second source-side pad 50A laterally abutting the second semiconductor link portion 50C on one side, and a second drain-side pad 50B laterally abutting the second semiconductor link portion 30C on an opposite side.

The exposed sidewalls of the first and second semiconductor structures (30A, 30B, 30C, 50A, 50B, 50C) are substantially vertically coincident with the sidewalls of the photoresist 7. Further, the sidewalls of the patterned portions of the buried insulator layer 20 are substantially vertically coincident with the sidewalls of the photoresist 7 and the sidewalls of the first and second semiconductor structures (30A, 30B, 30C, 50A, 50B, 50C). The photoresist 7 is subsequently removed, for example, by ashing.

The first semiconductor link portion 30C has a first pair of sidewalls that are separated by the first width w1 and has a first surface orientation having a first oxidation rate in an oxidizing ambient. The first surface orientation is the second horizontal orientation. The second semiconductor link portion 50C has a second pair of sidewalls that are separated by a second width w2 and has a second surface orientation having a second oxidation rate in the oxidizing ambient. The second surface orientation is the fourth horizontal orientation.

The first oxidation rate and the second oxidation rate are dependent on the cross-sectional dimensions of the pre-oxidation beam, the oxide thickness already grown, the temperature of the oxidation, and the composition of the ambient gas. In general, the first oxidation rate and the second oxidation rate increases with temperature, oxygen content, the moisture content of the oxidizing ambient, and the pre-oxidation dimensions. The first oxidation rate and the second oxidation rate depend on the semiconductor material of the first and second semiconductor structures (30A, 30B, 30C, 50A, 50B, 50C) and the first and second surface orientations.

For example, the oxidation rate for a (111) surface of silicon is typically from 1.01 to 1.68 times the oxidation rate for a (100) surface of silicon at the same oxidizing ambient. The Oxidation rate for a (110) surface of silicon is typically from 1.01 to 1.45 times the oxidation rate for the (100) surface of silicon. Thus, the ratio of the first oxidation rate to the second oxidation rate is typically not equal to 1.0 and is mainly a function of the crystallographic orientation of the first pair of sidewalls of the first semiconductor link portion 30C, the crystallographic orientation of the second pair of sidewalls of the second semiconductor link portion 50C, the dimensions of the cross-sectional dimensions of the initial beam, and the oxidation temperature. In the illustrated example, the surface orientation of the first pair of sidewalls is a (1 10) surface orientation and the surface orientation of the second pair of sidewalls is a (010) surface orientation.

The height of the first semiconductor structure (30A, 30B, 30C) and the second semiconductor structure (50A, 50B, 50C), which is herein referred to as an initial height h0, may be uniform throughout if the thickness of the top semiconductor layer 28 (See FIGS. 1B and 1C) is uniform. The initial height h0 may be substantially the same as the thickness of the top semiconductor layer 28.

Referring to FIGS. 3A-3C, a substantially isotropic etch is performed on the dielectric material of the buried insulator layer 20 selective to the semiconductor material of the first semiconductor structure (30A, 30B, 30C) and the second semiconductor structure (50A, 50B, 50C). The first semiconductor structure (30A, 30B, 30C) and the second semiconductor structure (50A, 50B, 50C) are employed as an etch mask for the substantially isotropic etch. The substantially isotropic etch may be a wet etch or a dry etch. Because the etch is substantially isotropic, the edges of the first semiconductor structure (30A, 30B, 30C) and the second semiconductor structure (50A, 50B, 50C) are undercut as the etch progresses. The etch proceeds at least until the portions of the buried insulator layer 20 located directly underneath the first semiconductor structure (30A, 30B, 30C) and the second semiconductor structure (50A, 50B, 50C) are removed so that the first and second semiconductor link portions (30C, 50C) become suspended over the remaining portions of the buried insulator layer 20. In other words, the first and second semiconductor link portions (30C, 50C) do not have direct physical contact with the remaining portions of the buried insulator layer 20, which is herein referred to as a dielectric material layer 22, after the etch.

The etch also removes the dielectric material of the buried insulator layer 20 from underneath the peripheral portions of the first source-side pad 30A, the first drain-side pad 30B, the second source-side pad 50A, and the second drain-side pad 50B. A first dielectric pedestal 22A comprising a remaining portion of the buried insulator layer 20 is formed directly underneath a center portion of the first source-side pad 30A. Likewise, a second dielectric Pedestal 22B is formed directly underneath a center portion of the first drain-side pad 30B, a third dielectric pedestal 42A is formed directly underneath a center portion of the second source-side pad 50A, and a fourth dielectric pedestal 42B is formed directly underneath a center portion of the second drain-side pad 50B. As the dielectric material is etched from underneath peripheral portions of the first and second semiconductor structures (30A, 30B, 30C, 50A, 50B, 50C) employing the first and second semiconductor structures (30A, 30B, 30C, 50A, 50B, 50C) as an etch mask, the buried insulator layer 20, which is a dielectric material layer, is undercut beneath the first and second semiconductor link portions (30C, 50C).

The first and second semiconductor link portions (30C, 50C) are suspended over a remaining portion of the buried insulator layer 20, which is the dielectric material layer 22. The first through fourth dielectric pedestals (22A, 22B, 42A, 42B) are integrally formed with the dielectric material layer 22, and are portions of the dielectric material layer 22. The first and second semiconductor structures (30A, 30B, 30C, 50A, 50B, 50C) contact the dielectric material layer 22, which incorporates the first through fourth dielectric pedestals (22A, 22B, 42A, 42B), at bottom surfaces of the first source-side pad 30A, the first drain-side pad 30B, the second source side pad 50A, and the second drain-side pad 50B.

Figure 4C:
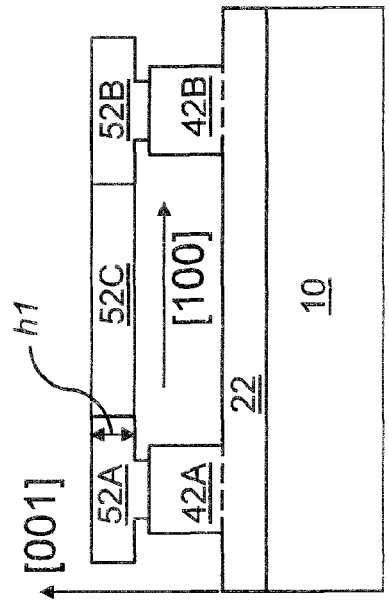
FIG. 4C is a vertical cross-sectional view of the exemplary semiconductor structure along the plane C-C' at the step corresponding to FIG. 4A.
Figure 4B:
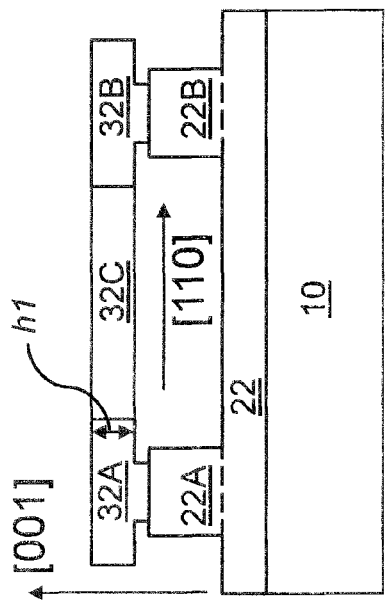
FIG. 4B is a vertical cross-sectional view of the exemplary semiconductor structure along the plane B-B' at the step corresponding to FIG. 4A.

Referring to FIGS. 4A-4C, the first and second semiconductor structures (30A, 30B, 30C, 50A, 50B, 50C) are thinned, i.e., dimensions of the first and second semiconductor structures (30A, 30B, 30C, 50A, 50B, 50C) are reduced, for example, by oxidation. Specifically, exposed peripheral portions of the first and second semiconductor structures (30A, 30B, 30C, 50A, 50B, 50C) including the first and second semiconductor links (30C, 50C) are converted into oxide material portions by oxidation. The semiconductor oxide material is subsequently removed by an isotropic etch such as a wet etch. For example, if the first and second semiconductor structures (30A, 30B, 30C, 50A, 50B, 50C) include silicon, the semiconductor oxide material may be silicon oxide, which may be removed by hydrofluoric acid (HF). Alternately, an isotropic wet etch or an isotropic dry etch may be employed to thin the first and second semiconductor structures (30, 50) by removing the exposed outer portions of the semiconductor material.

The remaining portions of the first semiconductor structure (30A, 30B, 30C) include a first thinned source-side pad 32A, a first thinned drain-side pad 32B, and a first semiconductor nanowire 32C. The first thinned source-side pad 32A and the first thinned drain-side pad 32B laterally abut the first semiconductor nanowire 32C. The remaining portions of the second semiconductor structure (50A, 50B, 50C) include a second thinned source-side pad 52A, a second thinned drain-side pad 52B, and a second semiconductor nanowire 52C. The second thinned source-side pad 52A and the second thinned drain-side pad 52B laterally abut the second semiconductor nanowire 52C. The first thinned source-side pad 32A, the first thinned drain-side pad 32B, and the first semiconductor nanowire 32C are collectively referred to as a thinned first semiconductor structure (32A, 32B, 32C), i.e., a first semiconductor structure after thinning. The second thinned source-side pad 52A, the second thinned drain-side pad 52B, and the second semiconductor nanowire 52C are collectively referred to as a thinned second semiconductor structure (52A, 52B, 52C), i.e., a second semiconductor structure after thinning.

The first semiconductor nanowire 32C has a rectangular vertical cross-sectional area in a plane perpendicular to the first horizontal direction. The width of the first semiconductor nanowire 32C, which is the dimension of the first semiconductor nanowire 32C in the second horizontal direction between the pair of first sidewalls as recessed by the thinning, is herein referred to as a third width w3. The third width w3 is less than the first width w1 because the semiconductor material is consumed during the thinning process. Preferably, the third width w3 is a sublithographic dimension, i.e., a dimension that is less than the smallest dimension that may be printed with a single lithographic exposure on a photoresist. Typically, the third width w3 is from 1 nm to 20 nm, although lesser and greater dimensions are also contemplated herein. Preferably, the third width w3 is from 2 nm to 10 nm.

The second semiconductor nanowire 52C has a rectangular vertical cross-sectional area in a plane perpendicular to the third horizontal direction. The width of the second semiconductor nanowire 52C, which is the dimension of the second semiconductor nanowire 52C in the fourth horizontal direction between the pair of second sidewalls as recessed by the thinning, is herein referred to as a fourth width w4. The fourth width w4 is less than the second width w2 because the semiconductor material is consumed during the thinning process. The fourth width w4 is a sublithographic dimension. Typically, the fourth width w4 is from 1 nm to 20 nm, although lesser and greater dimensions are also contemplated herein. Preferably, the fourth width w4 is from 2 nm to 10 nm.

As discussed above, the first and third horizontal directions may be selected to include vertical planes that provide the maximum hole mobility or maximum electron mobility. If the first conductivity type is n-type and the second conductivity type is p-type, the first pair of sidewalls may be parallel to a vertical plane at which hole mobility is at a maximum among all vertical planes in the single crystalline semiconductor material constituting the first semiconductor nanowire 32C and the second pair of sidewalls is parallel to a vertical plane at which electron mobility is at a maximum among all vertical planes in the single crystalline semiconductor material constituting the second semiconductor nanowire 52C. In a non-limiting illustrative example, the first and second semiconductor nanowires (32C, 52C) comprise silicon and have top surfaces having a (001) surface orientation, and the first pair of sidewalls has a ($\bar{1}$10) surface orientation, and the second pair of sidewalls has a (010) surface orientation.

In one embodiment, the third width w3 and the fourth width w4 may be matched within a predefined margin of error or a predefined allowable offset. For example, the fourth width w4 may be between 10% and 1000% of the third width w3. In other words, the ratio of the greater of the third width w3 and the fourth width w4 to the lesser of the third width w3 and the fourth width w4 is preferably from 1.0 to 10. In a preferred embodiment, the ratio of the greater of the third width w3 and the fourth width w4 to the lesser of the third width w3 and the fourth width w4 is preferably from 1.0 to 1.68. In some cases, the third width w3 may be substantially the same as the fourth width w4.

The entirety of the thinned first semiconductor structure (32A, 32B, 32C) and the entirety of the thinned second semiconductor structure (52A, 52B, 52C) may have a same thickness, which is herein referred to as a thinned thickness h1. The thinned thickness h1 is less than the initial thickness h0. The difference between the initial thickness h0 and the thinned thickness h1 is determined by the semiconductor material of the thinned first semiconductor structure (32A, 32B, 32C) and the thinned second semiconductor structure (52A, 52B, 52C), the crystallographic orientation of the top surface of the thinned first semiconductor structure (32A, 32B, 32C) and the thinned second semiconductor structure (52A, 52B, 52C), and the oxidation ambient employed in the thinning process.

Figure 5A:
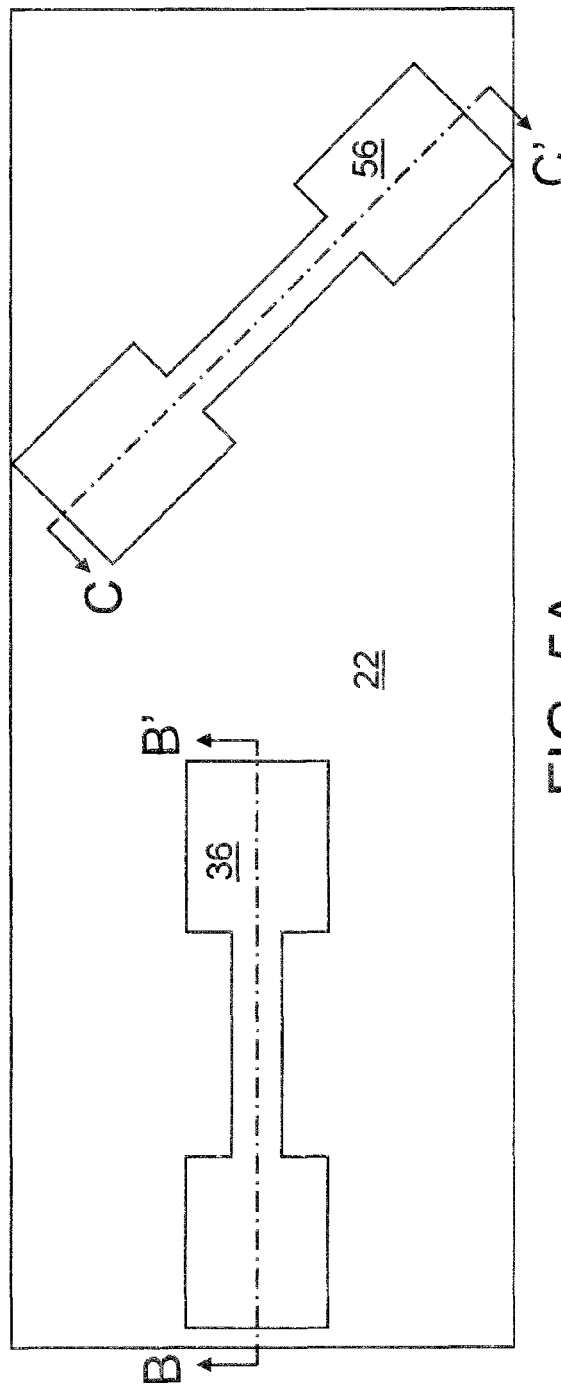
FIG. 5A is a top-down view of the exemplary semiconductor structure after formation of gate dielectrics.
Figure 5C:
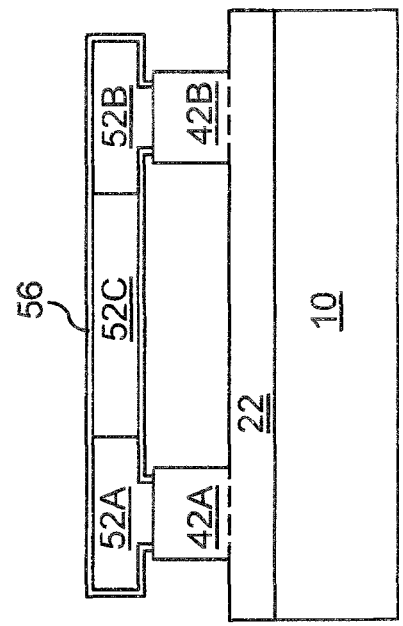
FIG. 5C is a vertical cross-sectional view of the exemplary semiconductor structure along the plane C-C' at the step corresponding to FIG. 5A.
Figure 5B:
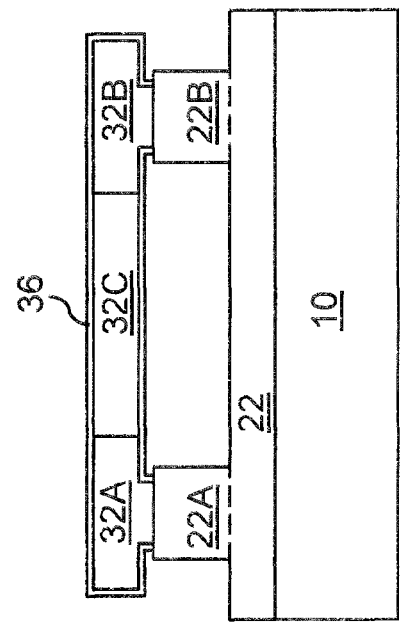
FIG. 5B is a vertical cross-sectional view of the exemplary semiconductor structure along the plane B-B' at the step corresponding to FIG. 5A.

Referring to FIGS. 5A-5C, a first gate dielectric 36 is formed on the exposed surfaces of the thinned first semiconductor structure (32A, 32B, 32C) and a second gate dielectric 56 is formed on the exposed surfaces of the thinned second semiconductor structure (52A, 52B, 52C).

In one case, the first gate dielectric 36 and the second gate dielectric 56 comprise a dielectric material formed by thermal conversion of outer portions of the thinned first semiconductor structure (32A, 32B, 32C) and the thinned second semiconductor structure (52A, 52B, 52C), such as silicon oxide or silicon nitride. Thermal oxidation, thermal nitridation, plasma oxidation, plasma nitridation, or a combination thereof may be employed to form the first gate dielectric 36 and the second gate dielectric 56. In this case, the first gate dielectric 36 and the second gate dielectric 56 are formed only on the surfaces of the thinned first semiconductor structure (32A, 32B, 32C) and the thinned second semiconductor structure (52A, 52B, 52C). The thickness of the first gate dielectric 36 and the second gate dielectric 56 may be from about 0.8 nm to about 10 nm, and is typically from about 1.1 nm to about 6 nm.

In another case, the first gate dielectric 36 and the second gate dielectric 56 may comprise a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited. In this case, the first gate dielectric 36 and the second gate dielectric 56 may be formed as a single contiguous gate dielectric layer covering the entirety of the top surfaces and sidewall surfaces of the thinned first semiconductor structure (32A, 32B, 32C) and the thinned second semiconductor structure (52A, 52B, 52C) and all exposed surfaces of the dielectric material layer 22 including the first through fourth dielectric pedestals (22A, 22B, 42A, 42B). In this case, the thickness of the first gate dielectric 36 and the second gate dielectric 56 may be from about 1 nm to about 6 nm, and may have an effective oxide thickness on the order of or less than 1 nm.

Referring to FIGS. 6A-6C, a first gate electrode 38 is formed on and around a middle portion of the first semiconductor nanowire 32C (See FIG. 5B) and a second gate electrode 58 is formed on and around a middle portion of the second semiconductor nanowire (See FIG. 5C). The first and second gate electrodes (38, 58) may comprise the same material or a different material, and may be formed simultaneously by a single deposition step and a single lithographic patterning step, or may be formed employing multiple deposition steps and at least one lithographic patterning steps.

The first gate electrode 38 and the second gate electrode 58 comprise at least one conductive material such as a doped semiconductor material, a metal, a metallic alloy, a conductive compound of at least one metal, or combinations thereof. Preferably, the thickness of the deposited gate electrode material exceeds half the distance between the first and second semiconductor nanowires (32C, 52C; See FIGS. 5B and 5C) and the dielectric material layer 22 so that each of the first and the second gate electrodes (38, 58) contains only one hole within which one of the first and the second semiconductor nanowires (32C, 52C) is located.

In one embodiment, at least one of the first and the second gate electrodes (38, 58) may comprise an amorphous or polycrystalline semiconductor material such as polysilicon, amorphous silicon, a silicon-germanium alloy, a silicon-carbon alloy, a silicon-germanium-carbon alloy, or a combination thereof. The first and the second gate electrodes (38, 58) may be in-situ doped, or may be doped by a subsequent ion implantation of dopant ions.

Alternately or additionally, at least one of the first and the second gate electrodes (38, 58) may comprise a metal gate material, which comprises a metallic conductive material. For example, the at least one of the first and the second gate electrodes (38, 58) may comprise a material such as TaN, TiN, WN, TiAlN, TaCN, other conductive refractory metal nitride, or an alloy thereof. The metal gate material may be formed by chemical vapor deposition (CVD), physical vapor deposition (PVD), atomic layer deposition (ALD), etc. and comprising a conductive refractory metal nitride. In case the first gate dielectric 36 and the second gate dielectric 56 comprise a high-k gate dielectric material, the metal gate material may be formed directly on the first gate dielectric 36 and the second gate dielectric 56. The composition of the metal gate material may be selected to optimize threshold voltages of semiconductor devices to be subsequently formed in the thinned first semiconductor structure (32A, 32B, 32C) and the thinned second semiconductor structure (52A, 52B, 52C). Each of the at least one of the first and the second gate electrodes (38, 58) may include both a metal gate material and a semiconductor material.

Optionally, dielectric spacers (not shown) may be formed on the sidewalls of the first and second gate electrodes (38,

58) as needed, for example, to control the overlap between the first and second gate electrodes (38, 58) and source and drain regions of semiconductor nanowire transistors to be formed.

Dopants of the second conductivity type are implanted into the first device region 2 employing the first gate electrode 38 as an ion implantation mask. The second device region 4 may be covered with a block mask during the implantation of the dopants of the second conductivity type. The first thinned source-side pad 32A and the first thinned drain-side pad 32B are doped with dopants of the second conductivity type, which are herein referred to as a first pad source portion 33A and a first pad drain portion 37A. One end of the first semiconductor nanowire 32C (See FIG. 5B) abutting the first pad source portion 33A is also doped with dopants of the second conductivity type and is herein referred to as a first nanowire source portion 33B. The first pad source portion 33A and the first nanowire source portion 33B have a doping of the second conductivity type and are collectively called a first source region 33. The other end of the first semiconductor nanowire 32C (See FIG. 5B) abutting the first pad drain portion 37A is also doped with dopants of the second conductivity type and is herein referred to as a first nanowire drain portion 37B. The first pad drain portion 37A and the first nanowire drain portion 37B have a doping of the second conductivity type and are collectively called a first drain region 37. The middle portion of the first semiconductor nanowire 32C (See FIG. 5B) that is not implanted with dopants of the second conductivity type has a doping of the first conductivity type, and is herein referred to as a first channel region 35. The first channel region 35 laterally abuts the first source region 33 and the first drain region 37. The first channel region 35, the first source region 33, the first drain region 37, the first gate dielectric 36, and the first gate electrode 38 collectively constitute a first semiconductor nanowire transistor that controls the flow of current through the first semiconductor nanowire (35, 33B, 37B).

Dopants of the first conductivity type are implanted into the second device region 4 employing the second gate electrode 58 as an ion implantation mask. The first device region 2 may be covered with a block mask during the implantation of the first conductivity type. The second thinned source-side pad 52A and the second thinned drain-side pad 52B are doped with dopants of the first conductivity type, which are herein referred to as a second pad source portion 53A and a second pad drain portion 57A. One end of the second semiconductor nanowire 52C (See FIG. 6C) abutting the second pad source portion 53A is also doped with dopants of the first conductivity type and is herein referred to as a second nanowire source portion 53B. The second pad source portion 53A and the second nanowire source portion 53B have a doping of the first conductivity type and are collectively called a second source region 53. The other end of the second semiconductor nanowire 52C (See FIG. 5C) abutting the second pad drain portion 57A is also doped with dopants of the first conductivity type and is herein referred to as a second nanowire drain portion 57B. The second pad drain portion 57A and the second nanowire drain portion 57B have a doping of the first conductivity type and are collectively called a second drain region 57. The middle portion of the second semiconductor nanowire 52C (See FIG. 5C) that is not implanted with dopants of the first conductivity type has a doping of the second conductivity type, and is herein referred to as a second channel region 55. The second channel region 55 laterally abuts the second source region 53 and the second drain region 57. The second channel region 55, the second source region 53, the second drain region 57, the second gate dielectric 56, and the second gate electrode 58 collectively constitute a second semiconductor nanowire transistor that controls the flow of current through the second semiconductor nanowire (55, 53B, 57B).

Referring to FIGS. 7A-7C, a middle-of-line (MOL) dielectric material layer 80 is formed over the first and second semiconductor nanowire transistors. The MOL dielectric material layer 80 may include a mobile ion diffusion barrier layer (not shown) which comprises a material that blocks the diffusion of mobile ions such as Na+ and K+. Typical material employed for the mobile ion diffusion barrier layer includes silicon nitride. The MOL dielectric material layer 80 may include for example, a CVD oxide, spin-on low dielectric constant material having a dielectric constant less than 2.8, an organosilicate glass or a CVD low dielectric material having a dielectric constant less than 2.8, or any other dielectric material that may be employed for a back-end-of-line (BEOL) dielectric layer in metal interconnect structures. For example, The CVD oxide may be an undoped silicate glass (USG), borosilicate glass (BSG), phosphosilicate glass (PSG), fluorosilicate glass (FSG), borophosphosilicate glass (BPSG), or a combination thereof. The MOL dielectric layer 80 fills the spaces between the dielectric material layer 22 and the first and second semiconductor nanowire (35, 33B, 37B, 55, 53B, 57B).

Various contact via holes are formed in the MOL dielectric layer 80 and filled with a conductive material to from various contact vias. Specifically, a first source-side contact via 42A is formed directly on the first pad source portion 33A, a first drain-side contact via 42B is formed directly on the first pad drain portion 37A, a first gate-side contact via 48 is formed directly on the first gate electrode 38. Likewise, a second source-side contact via 62A is formed directly on the second pad source portion 53A, a second drain-side contact via 62B is formed directly on the second pad drain portion 57A, a second gate-side contact via 68 is formed directly on the second gate electrode 58. The top surfaces of the MOL dielectric layer 80, the first source-side contact via 42A, the first drain-side contact via 42B, the first gate-side contact via 48, the second source-side contact via 62A, the second drain-side contact via 62B, and the second gate-side contact via 68 may be substantially coplanar after planarization of the MOL dielectric layer 80 and removal of the excess conductive material. Additional metal interconnect structures (not shown) including a first level metal wiring (not shown) may be formed above the MOL dielectric layer 80.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure, the method comprising:
    patterning a first semiconductor structure including a first semiconductor link portion, wherein said first semiconductor structure has a first pair of sidewalls that are separated by a first width w1 and has a first surface orientation having a first oxidation rate in an oxidizing ambient;
    patterning a second semiconductor structure including a second semiconductor link portion, wherein said second semiconductor link portion has a second pair of sidewalls that are separated by a second width w2 and has a second surface orientation having a second oxidation rate in said oxidizing ambient;
    forming a first semiconductor nanowire having a third width w3 by thinning said first semiconductor link portion at said first oxidation rate; and
    forming a second semiconductor nanowire having a fourth width w4 by thinning said second semiconductor link portion at said second oxidation rate, wherein said third width w3 and said fourth width w4 are sublithographic dimensions.

2. The method of claim 1, wherein a ratio R of a difference between said first width w1 and said third width w3 to a difference between said second width w2 and said fourth width w4 is the same as the ratio of said first oxidation rate to said second oxidation rate.

3. The method of claim 2, wherein said first width w1 and said second with w2 are lithographic dimensions.

4. The method of claim 1, wherein said first semiconductor structure further comprises a first source-side pad and a first drain-side pad that have widths greater than said first width w1, and wherein said second semiconductor structure further comprises a second source-side pad and second drain-side pad that have widths greater than said second width w2.

5. The method of claim 4, further comprising thinning said first source-side pad, said first drain-side pad, said second source-side pad, and said second drain-side, and said first and second semiconductor link portions simultaneously.

6. The method of claim 5, wherein said first source-side pad, said first drain-side pad, said second source-side pad, and said second drain-side pad have a same thickness as said first and second semiconductor link portions prior to thinning.

7. The method of claim 6, wherein said first source-side pad, said first drain-side pad, said second source-side pad, and said second drain-side pad have a same thickness as said first and second semiconductor nanowires after thinning.

8. The method of claim 4, further comprising etching a dielectric material layer from underneath said first and second semiconductor structures employing said first and second semiconductor structures as an etch mask, wherein said dielectric material layer is undercut beneath said first and second semiconductor link portions.

9. The method of claim 8, wherein said first and second semiconductor link portions are suspended over a remaining portion of said dielectric material layer, and wherein said first and second semiconductor structures contact said dielectric material layer at bottom surfaces of said first source-side pad, said first drain-side pad, said second source-side pad, and said second drain-side pad.

10. The method of claim 1, further comprising patterning a single crystalline semiconductor layer, wherein said first semiconductor structure and said second semiconductor structure are formed by patterned portions of said single crystalline semiconductor layer.

11. The method of claim 1, wherein said first pair of sidewalls is parallel to a vertical plane at which hole mobility is at a maximum among all vertical planes in said single crystalline semiconductor layer.

12. The method of claim 1, wherein said second pair of sidewalls is parallel to a vertical plane at which electron mobility is at a maximum among all vertical planes in said single crystalline semiconductor layer.

13. The method of claim 1, wherein said third width w3 and said fourth width w4 are from 1 nm to 20 nm, and wherein said third width and said fourth width are from 2 nm to 10 nm.

14. The method of claim 13, wherein a ratio of the greater of said third width w3 and said fourth width w4 to the lesser of said third width w3 and said fourth width w4 is from 0.1 to 10.

15. The method of claim 14, wherein a ratio of the greater of said third width w3 and said fourth width w4 to the lesser of said third width w3 and said fourth width w4 is from 1.0 to 1.68.

16. The method of claim 1, further comprising:
converting peripheral portions of said first and second semiconductor link portions into oxide material portions by oxidation; and
removing said oxide material portions, whereby said first and second semiconductor link portions are thinned.

17. The method of claim 1, wherein said first and second semiconductor structures are formed on a dielectric material layer, wherein said dielectric material layer is a buried insulator layer of a semiconductor-on-insulator (SOI) substrate, and wherein said first and second semiconductor structures are formed by patterning a top semiconductor layer of said SOI substrate.

18. The method of claim 1, further comprising:
forming a first gate dielectric around said first semiconductor nanowire;
forming a second gate dielectric around said second semiconductor nanowire;
forming a first gate electrode around said first gate dielectric; and
forming a second gate electrode around said second gate dielectric.

19. The method of claim 18, wherein said first semiconductor structure further comprises a first source-side pad and a first drain-side pad that have widths greater than said first width w1, and wherein said second semiconductor structure further comprises a second source-side pad and second drain-side pad that have widths greater than said second width w2, and wherein said method further comprises:
doping said first source-side pad and said first drain-side pad with dopants of a second conductivity type; and
doping said second source-side and said second drain-side pad with dopants of a first conductivity type, wherein said second conductivity type is the opposite of said first conductivity type.

20. The method of claim 19, wherein said first semiconductor nanowire has a doping of said first conductivity type, and wherein said second semiconductor nanowire has a doping of said second conductivity type.

* * * * *